(12) United States Patent
Mizerak et al.

(10) Patent No.: US 12,100,643 B2
(45) Date of Patent: Sep. 24, 2024

(54) THERMAL MANAGEMENT OF ELECTRONICS USING CO-LOCATED MICROJET NOZZLES AND ELECTRONIC ELEMENTS

(71) Applicant: Jetcool Technologies, Inc., Littleton, MA (US)

(72) Inventors: Jordan Mizerak, Boston, MA (US); Bernard Malouin, Westford, MA (US)

(73) Assignee: JetCool Technologies, Inc., Littleton, MA (US)

(*) Notice: Subject to any disclaimer, the term of this patent is extended or adjusted under 35 U.S.C. 154(b) by 459 days.

(21) Appl. No.: 15/931,134

(22) Filed: May 13, 2020

(65) Prior Publication Data

US 2020/0343160 A1    Oct. 29, 2020

Related U.S. Application Data

(63) Continuation of application No. PCT/US2020/027611, filed on Apr. 10, 2020.

(Continued)

(51) Int. Cl.
*H01L 23/473* (2006.01)
*F28F 3/12* (2006.01)
(Continued)

(52) U.S. Cl.
CPC ........... *H01L 23/4735* (2013.01); *F28F 3/12* (2013.01); *F28F 13/06* (2013.01); *F28F 13/08* (2013.01);
(Continued)

(58) Field of Classification Search
CPC .... H01L 23/4735; H01L 23/4336; F28F 3/12; F28F 13/06; F28F 13/08; F28F 13/185;
(Continued)

(56) References Cited

U.S. PATENT DOCUMENTS

| 236,519 A | 1/1881 | Walsh |
| 3,765,728 A | 10/1973 | Peruglia |

(Continued)

FOREIGN PATENT DOCUMENTS

| CN | 102414813 B | 4/2014 |
| CN | 107567247 A | 1/2018 |

(Continued)

OTHER PUBLICATIONS

The International Search Report and The Written Opinion of the International Searching Authority dated Jul. 24, 2020 for PCT Application No. PCT/US20/27611.

(Continued)

*Primary Examiner* — Raheena R Malik
(74) *Attorney, Agent, or Firm* — Grady L. White; Potomac Law Group, PLLC

(57) ABSTRACT

An electronics assembly in which microjet nozzles are co-located with electronic elements on the same substrate or layer. This technique may be used to integrate lower power-density electronics onto an existing microjet nozzle plate to perform microjet nozzle cooling, which removes the need for separate thermal management solutions for systems that contain both high and lower power-density elements in proximity. This technique may also be used in multilayered 3D integrated electronic substrates, allowing for thin, high performing thermal management solutions in 3D integrated stackups using microjets.

10 Claims, 7 Drawing Sheets

Related U.S. Application Data

(60) Provisional application No. 62/831,848, filed on Apr. 10, 2019.

(51) Int. Cl.

| | | |
|---|---|---|
| *F28F 13/06* | (2006.01) | |
| *F28F 13/08* | (2006.01) | |
| *F28F 13/18* | (2006.01) | |
| *H05K 7/20* | (2006.01) | |
| *H01L 23/433* | (2006.01) | |

(52) U.S. Cl.
CPC ....... *F28F 13/185* (2013.01); *H05K 7/20272* (2013.01); *H05K 7/20281* (2013.01); *H05K 7/205* (2013.01); *F28F 2210/10* (2013.01); *H01L 23/4336* (2013.01)

(58) Field of Classification Search
CPC ............ F28F 2210/10; H05K 7/20272; H05K 7/20281; H05K 7/205
See application file for complete search history.

(56) References Cited

U.S. PATENT DOCUMENTS

| | | | |
|---|---|---|---|
| 3,841,671 A | 10/1974 | Walker | |
| 3,980,112 A | 9/1976 | Basham | |
| 4,062,572 A | 12/1977 | Davis | |
| 4,090,539 A | 5/1978 | Krupp | |
| 4,696,496 A | 9/1987 | Guelis et al. | |
| 4,796,924 A | 1/1989 | Kosugi et al. | |
| 4,890,865 A | 1/1990 | Hosono et al. | |
| 4,922,971 A | 5/1990 | Grantham | |
| 5,021,924 A | 6/1991 | Kieda et al. | |
| 5,088,005 A | 2/1992 | Ciaccio | |
| 5,249,358 A | 10/1993 | Tousignant et al. | |
| 5,263,536 A | 11/1993 | Hulburd et al. | |
| 5,285,351 A | 2/1994 | Ikeda | |
| 5,309,319 A | 5/1994 | Messina | |
| 5,316,075 A | 5/1994 | Quon et al. | |
| 5,349,831 A | 9/1994 | Daikoku et al. | |
| 5,401,064 A | 3/1995 | Guest | |
| 5,491,363 A | 2/1996 | Yoshikawa | |
| 5,547,231 A | 8/1996 | Sharp | |
| 5,611,373 A | 3/1997 | Ashcraft | |
| 5,687,993 A | 11/1997 | Brim | |
| 5,720,325 A | 2/1998 | Grantham | |
| 5,959,351 A | 9/1999 | Sasaki et al. | |
| 5,999,404 A | 12/1999 | Hileman | |
| 6,105,373 A | 8/2000 | Watanabe et al. | |
| 6,144,013 A | 11/2000 | Chu et al. | |
| 6,366,462 B1 | 4/2002 | Chu et al. | |
| 6,528,878 B1 | 3/2003 | Daikoku et al. | |
| 6,546,951 B1 | 4/2003 | Armenia et al. | |
| 6,550,263 B2 | 4/2003 | Patel et al. | |
| 6,550,815 B2 | 4/2003 | Zitkowic, Jr. et al. | |
| 6,729,383 B1 | 5/2004 | Cannell et al. | |
| 6,952,346 B2 | 10/2005 | Tilton et al. | |
| 6,973,801 B1 | 12/2005 | Campbell et al. | |
| 7,007,506 B2 | 3/2006 | Kubo et al. | |
| 7,104,312 B2 | 9/2006 | Goodson et al. | |
| 7,149,087 B2 | 12/2006 | Wilson et al. | |
| 7,223,494 B2 | 5/2007 | Takeshita et al. | |
| 7,233,494 B2 | 6/2007 | Campbell et al. | |
| 7,241,423 B2 | 7/2007 | Golbig et al. | |
| 7,265,976 B1 | 9/2007 | Knight | |
| 7,277,283 B2 | 10/2007 | Campbell et al. | |
| 7,511,957 B2 | 3/2009 | Campbell et al. | |
| 7,787,248 B2 | 8/2010 | Campbell et al. | |
| 7,802,442 B2 | 9/2010 | Bezama et al. | |
| 7,866,173 B2 | 1/2011 | Brunschwiler et al. | |
| 7,916,483 B2 | 3/2011 | Campbell et al. | |
| 7,978,473 B2 | 7/2011 | Campbell et al. | |
| 7,992,627 B2 | 8/2011 | Bezama et al. | |
| 8,059,405 B2 | 11/2011 | Campbell et al. | |
| 8,266,802 B2 | 9/2012 | Campbell et al. | |
| 8,824,146 B2 * | 9/2014 | Brok ................... | H05K 1/0272 361/698 |
| 8,912,643 B2 | 12/2014 | Bock et al. | |
| 8,929,080 B2 | 1/2015 | Campbell et al. | |
| 8,944,151 B2 | 2/2015 | Flotta et al. | |
| 8,981,556 B2 | 3/2015 | Joshi | |
| 9,165,857 B2 | 10/2015 | Song et al. | |
| 9,247,672 B2 | 1/2016 | Mehring | |
| 9,252,069 B2 | 2/2016 | Bhunia et al. | |
| 9,445,529 B2 | 9/2016 | Chainer et al. | |
| 9,484,283 B2 | 11/2016 | Joshi et al. | |
| 9,521,787 B2 | 12/2016 | Chainer et al. | |
| 9,530,818 B2 | 12/2016 | Stern et al. | |
| 9,559,038 B2 | 1/2017 | Schmit et al. | |
| 9,560,790 B2 | 1/2017 | Joshi et al. | |
| 9,622,379 B1 | 4/2017 | Campbell et al. | |
| 9,638,477 B1 | 5/2017 | Choi et al. | |
| 9,653,378 B2 | 5/2017 | Hou et al. | |
| 9,750,159 B2 | 8/2017 | Campbell et al. | |
| 9,852,963 B2 | 12/2017 | Shedd et al. | |
| 9,901,008 B2 | 2/2018 | Shedd et al. | |
| 9,903,664 B2 | 2/2018 | Joshi | |
| 10,078,354 B2 | 9/2018 | Eriksen et al. | |
| 10,152,096 B1 | 12/2018 | Chen et al. | |
| 10,228,735 B2 | 3/2019 | Kulkarni et al. | |
| 10,270,220 B1 | 4/2019 | Eppich et al. | |
| 10,285,309 B2 | 5/2019 | James et al. | |
| 10,306,802 B1 | 5/2019 | Ditri et al. | |
| 10,426,062 B1 | 9/2019 | Saunders | |
| 10,473,252 B2 | 11/2019 | Oberdorfer et al. | |
| 10,512,152 B2 | 12/2019 | Smith et al. | |
| 10,561,040 B1 | 2/2020 | Lunsman et al. | |
| 10,651,112 B2 | 5/2020 | Malouin, Jr. et al. | |
| 10,665,529 B2 | 5/2020 | Smith et al. | |
| 10,903,141 B2 | 1/2021 | Malouin, Jr. et al. | |
| 10,985,089 B2 | 4/2021 | Hart et al. | |
| 11,018,077 B2 | 5/2021 | Smith et al. | |
| 11,096,313 B2 | 8/2021 | Amos et al. | |
| 11,322,426 B2 | 5/2022 | Malouin, Jr. et al. | |
| 11,439,037 B2 | 9/2022 | Subrahmanyam et al. | |
| 11,594,470 B2 | 2/2023 | Smith et al. | |
| 11,710,678 B2 | 7/2023 | Ganti et al. | |
| 2002/0075651 A1 | 6/2002 | Newton et al. | |
| 2002/0113142 A1 | 8/2002 | Patel et al. | |
| 2004/0051308 A1 | 3/2004 | Coates | |
| 2004/0194492 A1 | 10/2004 | Tilton et al. | |
| 2005/0143000 A1 | 6/2005 | Eisele et al. | |
| 2005/0210906 A1 | 9/2005 | Laufer et al. | |
| 2005/0280994 A1 | 12/2005 | Yazawa | |
| 2006/0042825 A1 | 3/2006 | Lu et al. | |
| 2006/0250773 A1 | 11/2006 | Campbell et al. | |
| 2006/0250774 A1 | 11/2006 | Campbell et al. | |
| 2007/0017659 A1 | 1/2007 | Brunschwiler et al. | |
| 2007/0091569 A1 | 4/2007 | Campbell et al. | |
| 2007/0121294 A1 | 5/2007 | Campbell et al. | |
| 2007/0121299 A1 | 5/2007 | Campbell et al. | |
| 2007/0221364 A1 | 9/2007 | Lai et al. | |
| 2007/0272392 A1 | 11/2007 | Ghosh et al. | |
| 2007/0274045 A1 | 11/2007 | Campbell et al. | |
| 2007/0295480 A1 | 12/2007 | Campbell et al. | |
| 2008/0037221 A1 | 2/2008 | Campbell et al. | |
| 2008/0278913 A1 | 11/2008 | Campbell et al. | |
| 2009/0013258 A1 | 1/2009 | Hintermeister et al. | |
| 2009/0032937 A1 | 2/2009 | Mann et al. | |
| 2009/0284821 A1 | 11/2009 | Valentin et al. | |
| 2009/0294105 A1 | 12/2009 | Sundararajan et al. | |
| 2009/0294106 A1 | 12/2009 | Flotta et al. | |
| 2009/0314467 A1 | 12/2009 | Campbell et al. | |
| 2009/0316360 A1 | 12/2009 | Campbell et al. | |
| 2010/0276026 A1 | 11/2010 | Powell et al. | |
| 2010/0290190 A1 | 11/2010 | Chester et al. | |
| 2010/0328882 A1 | 12/2010 | Campbell et al. | |
| 2010/0328888 A1 | 12/2010 | Campbell et al. | |
| 2010/0328889 A1 | 12/2010 | Campbell et al. | |
| 2011/0277491 A1 | 11/2011 | Wu et al. | |
| 2012/0048515 A1 | 3/2012 | Bhunia et al. | |
| 2012/0063091 A1 | 3/2012 | Dede et al. | |
| 2012/0160459 A1 | 6/2012 | Flotta et al. | |

(56) References Cited

U.S. PATENT DOCUMENTS

| | | | |
|---|---|---|---|
| 2012/0212907 A1* | 8/2012 | Dede | H01L 23/4735 361/689 |
| 2014/0085823 A1 | 3/2014 | Campbell et al. | |
| 2014/0124167 A1 | 5/2014 | Campbell et al. | |
| 2014/0126150 A1 | 5/2014 | Song et al. | |
| 2014/0158326 A1 | 6/2014 | Lyon | |
| 2014/0190668 A1 | 7/2014 | Joshi et al. | |
| 2014/0204532 A1 | 7/2014 | Mehring | |
| 2014/0205632 A1 | 7/2014 | Gruber et al. | |
| 2014/0264759 A1* | 9/2014 | Koontz | H01L 24/80 438/456 |
| 2014/0284787 A1 | 9/2014 | Joshi | |
| 2014/0293542 A1 | 10/2014 | Vetrovec | |
| 2014/0352937 A1 | 12/2014 | Draht | |
| 2015/0043164 A1 | 2/2015 | Joshi | |
| 2015/0096722 A1 | 4/2015 | Zweiback et al. | |
| 2015/0131224 A1 | 5/2015 | Barina et al. | |
| 2015/0208549 A1 | 7/2015 | Shedd et al. | |
| 2016/0014932 A1 | 1/2016 | Best et al. | |
| 2016/0120058 A1 | 4/2016 | Shedd et al. | |
| 2016/0143184 A1 | 5/2016 | Campbell et al. | |
| 2016/0278239 A1 | 9/2016 | Chainer et al. | |
| 2017/0092565 A1 | 3/2017 | Chen et al. | |
| 2017/0150649 A1 | 5/2017 | Chester et al. | |
| 2017/0179001 A1 | 6/2017 | Brunschwiler et al. | |
| 2017/0347487 A1 | 11/2017 | Rudnicki et al. | |
| 2018/0027695 A1 | 1/2018 | Wakino et al. | |
| 2018/0040538 A1 | 2/2018 | Schuderer et al. | |
| 2018/0090417 A1 | 3/2018 | Gutala et al. | |
| 2018/0124949 A1 | 5/2018 | Marroquin et al. | |
| 2019/0013258 A1 | 1/2019 | Malouin, Jr. et al. | |
| 2019/0029105 A1 | 1/2019 | Smith et al. | |
| 2019/0195399 A1 | 6/2019 | Nguyen et al. | |
| 2019/0235449 A1 | 8/2019 | Slessman et al. | |
| 2019/0289749 A1 | 9/2019 | Dariavach et al. | |
| 2019/0348345 A1 | 11/2019 | Parida et al. | |
| 2020/0011620 A1 | 1/2020 | Sherrer et al. | |
| 2020/0015383 A1 | 1/2020 | Gao | |
| 2020/0027819 A1 | 1/2020 | Smith et al. | |
| 2020/0033075 A1 | 1/2020 | Veto et al. | |
| 2020/0100396 A1 | 3/2020 | Iyengar et al. | |
| 2020/0168526 A1 | 5/2020 | Malouin, Jr. et al. | |
| 2020/0214126 A1 | 7/2020 | Nakashima et al. | |
| 2020/0253092 A1 | 8/2020 | Chainer et al. | |
| 2020/0296862 A1 | 9/2020 | Iyengar et al. | |
| 2020/0312746 A1 | 10/2020 | Smith et al. | |
| 2020/0328139 A1 | 10/2020 | Chiu et al. | |
| 2020/0350231 A1 | 11/2020 | Shen et al. | |
| 2021/0134703 A1 | 5/2021 | Malouin, Jr. et al. | |
| 2021/0265240 A1 | 8/2021 | Smith et al. | |
| 2021/0351108 A1 | 11/2021 | Diglio et al. | |
| 2022/0151097 A1 | 5/2022 | McManis et al. | |
| 2022/0230937 A1 | 7/2022 | Malouin et al. | |
| 2022/0253112 A1 | 8/2022 | Hinton et al. | |

FOREIGN PATENT DOCUMENTS

| | | |
|---|---|---|
| CN | 105027021 B | 4/2019 |
| EP | 3188230 A1 | 7/2017 |
| KR | 20110028428 A | 3/2011 |
| KR | 20190077920 A | 7/2019 |
| WO | 2019018597 A1 | 1/2019 |

OTHER PUBLICATIONS

Celli, "Compressible fluids," retrieved from the Internet: http://galileo.phys.virginia.edu/classes/311/notes/compflu2/node1.html, 1997.

* cited by examiner

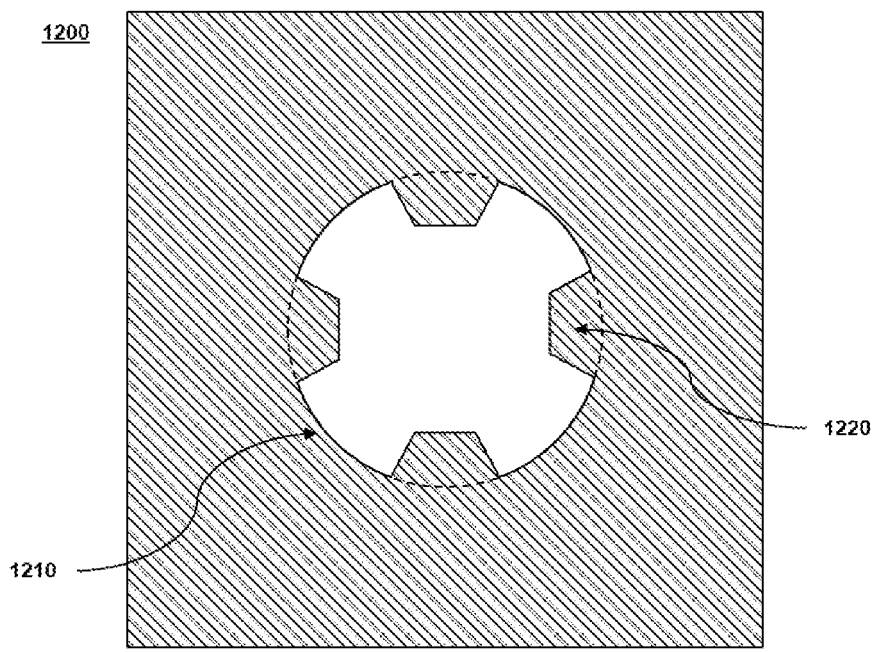
FIG. 12
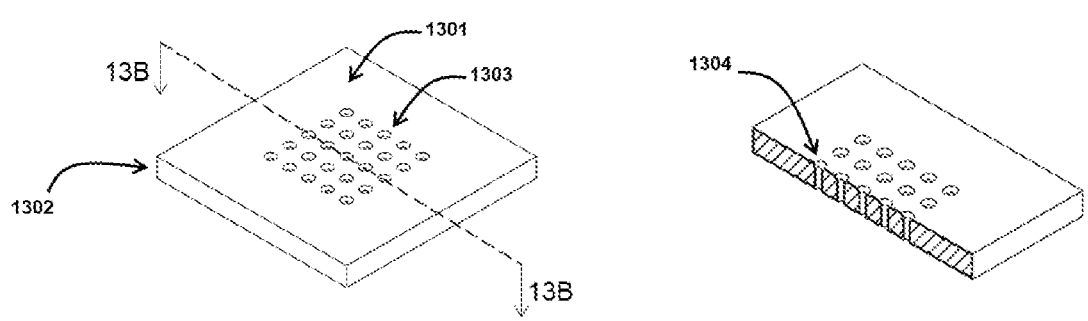
FIG. 13A
FIG. 13B

THERMAL MANAGEMENT OF ELECTRONICS USING CO-LOCATED MICROJET NOZZLES AND ELECTRONIC ELEMENTS

CROSS-REFERENCE TO RELATED APPLICATIONS

This application claims priority of PCT/US20/27611 filed on Apr. 10, 2020, which claimed priority of Provisional Patent Application 62/831,848 filed on Apr. 10, 2019. The entire disclosures of both prior applications are incorporated herein by reference for all purposes.

BACKGROUND

This disclosure relates to thermal management of electronics.

Electronics miniaturization and the concurrent increase in power have resulted in devices with increasing power-density. A challenging side effect of this trend is the skyrocketing amount of heat dissipated per unit area. Therefore, higher performance thermal management (cooling) techniques are becoming necessary to maintain safe component temperatures.

One such high-performance thermal management technique is microjet impingement cooling, where fluid is forced through small nozzles to generate high velocity jets that impinge upon a heated surface. Microjet cooling technology has been demonstrated to produce heat transfer coefficients in excess of 200,000 $W/m^2K$, more than 10× that of competing approaches (e.g., microchannels 20,000 $W/m^2K$). This allows the fluid to collect more heat, without the need for additional metal heat spreaders. Microjet cooling is further described in US Patent Application Publication 2019/0013258 and International Patent Application Publication WO 2019/018597, the disclosures of which are incorporated herein by reference in their entireties for all purposes.

Microjet impingement cooling is typically chosen for the highest power-density elements, as its greater performance comes at a reduced size and increased input power cost, but whose benefits may be unnecessary for many lower power-density electronics. However, many of today's complex systems include both high and lower power-density elements in proximity, which are typically cooled using separate thermal management solutions. This results in space inefficiency, of which size is a critical consideration in engineering systems.

Additionally, current advanced and future systems stack layers of electronics on top of each other (i.e., 3D integrated electronics layers) to produce more compact dies and package sizes. Thermal management of these stacked electronics layers is difficult, as thermal access to interior layers becomes blocked. Current solutions integrate microjet impingement cooling in between electronics layers, which requires many separate layers of thermal management to administer the high-performance cooling in a 3D integrated form factor. This results in larger thicknesses of 3D integrated packages and dies, of which size and integration ease are critical considerations in engineering systems.

SUMMARY

Therefore, it would be useful if there were a space-efficient way to cool lower power-density electronics and stacked electronics layers within an existing microjet cooling structure. This would avoid separate thermal management hardware, reduce the number of needed layers, and minimize the thickness of overall packages and dies, reducing system size.

This disclosure may involve any one or more of the following. Adding heat transfer functionality to the microjet nozzle layer by co-locating nozzles and electronic elements on the same substrate/layer—thus cooling nearby elements via microjet nozzle cooling. This may eliminate the need for separate thermal management hardware typically needed for lower power-density elements (significant size and weight reduction). Also, integration of nozzles into active electronics layers of a 3D integrated stackup to reduce the overall thickness of 3D integrated solutions. This can reduce stackup thickness by removing the separate microjet nozzle layer(s), reduce stackup thickness by allowing the microjet layer of one cooling layer to be merged with the manifold layer of the next cooling layer, allow for higher power components due to the combined cooling effect of microjet impingement cooling and microjet nozzle cooling acting together, reduce the number of inlet/outlet ports. Instead of a set of inlet/outlet ports being needed for each layer of cooling, only one set of inlet/outlet ports is needed for each daisy chain. This reduces the size and complexity of the stackup, and improve system-level fluid performance via enhanced flow routing, avoiding complex manifolding to route fluid to subsequent layers. Including area- or flow-enhancing features within the nozzles, increasing overall heat transfer thus increasing total heat transfer of microjet cooling technology with minimal system impact. Including inter-layer features between electronics layers for improved design. This provides structural support for improved stress distribution of stacked layers, strategically positions in relation to nozzles in order to provide enhanced fluid routing for improved fluid dynamics, serves to conduct heat from one layer to another, enhancing the effect of microjet nozzle or impingement cooling, and serves as passageways for electrical signals, optical signals, or other EM waves.

Note that this disclosure is not limited to the use of microjet cooling. Rather, the disclosure describes fluidic cooling of electronics and electrical components.

All examples and features mentioned below can be combined in any technically possible way.

In one aspect, an electronics assembly includes a first layer with a thickness, at least one active, heat-generating, electronic element disposed on or in the first layer, and at least one passageway that passes entirely through the thickness of the first layer. The passageway is configured to conduct fluid therethrough, to extract heat from the at least one electronic element.

Some examples include one of the above and/or below features, or any combination thereof. In an example the at least one passageway comprises a microjet nozzle. In an example the first layer comprises top and bottom surfaces, and an electronic element is on the top surface of the first layer. In an example the first layer comprises an electronics substrate. In an example the assembly further includes a second layer that is spaced from the first layer.

Some examples include one of the above and/or below features, or any combination thereof. In some examples the assembly further includes at least one active, heat-generating, electronic element disposed on or in the second layer. In an example the assembly further includes a manifold layer between the first and second layers that defines a reservoir that is configured to hold fluid. In an example the at least one passageway that passes entirely through the thickness of the first layer comprises a microjet nozzle that is configured to form a microjet. In an example the assembly further includes at least one passageway that passes entirely through the thickness of the second layer, wherein the passageway is configured to conduct fluid therethrough, to extract heat from the at least one electronic element disposed on or in the second layer. In an example the manifold layer comprises a fluid outlet. In an example the at least one passageway in the first layer is non-uniformly configured to provide more effective cooling to hot spots on the second layer. In an example the assembly further includes at least one passageway that passes entirely through the thickness of the second layer, wherein the passageway is configured to conduct fluid therethrough, to extract heat from the at least one electronic element that is disposed on or in the second layer.

Some examples include one of the above and/or below features, or any combination thereof. In some examples the assembly further comprises at least one structure spanning the spacing between the first and second layers such that the structure is in contact with the first and second layer. In an example the at least one structure is configured to conduct heat. In an example the at least one structure is configured to provide structural support of the electronics assembly. In an example the at least one structure is configured to aid fluid routing.

Some examples include one of the above and/or below features, or any combination thereof. In an example the at least one passageway that passes entirely through the thickness of the first layer comprises one or both of fluid-flow enhancement features and area-enhancement features within the passageway. In an example the at least one passageway that passes entirely through the thickness of the first layer contains a chamfer. In an example the at least one passageway that passes entirely through the thickness of the first layer defines a cross section that is not round. In an example the at least one passageway that passes entirely through the thickness of the first layer defines a cross section with an irregular circumference.

BRIEF DESCRIPTION OF THE DRAWINGS

For a better understanding of the present disclosure, reference is made to the accompanying drawings in which:

FIG. 12 shows a top view of an embodiment of an enhanced nozzle with features, to be used both for microjet impingement cooling as well as offer higher performance for microjet nozzle cooling.

FIGS. 13A and 13B shows an embodiment of an enhanced nozzle configured to have chamfers for improved fluid performance, where FIG. 13B is a cross-section taken along line 13B-13B, FIG. 13A.

DETAILED DESCRIPTION

The present disclosure describes the co-location of electronic elements with microjet (or other fluid-carrying) nozzles on the same substrate/layer, as a heat transfer-enhancing and space-saving mechanism for cooling lower power-density electronics and multilayered electronics stackups.

Microjet impingement is a heat transfer technique by which a jet, or an array of jets, impinge onto a surface for the purpose of transferring heat between the surface and the fluid of the jet. Jets can be formed by the use of nozzles, tubes or an orifice plate and are characterized by having a substantially higher momentum in one direction than the surrounding fluid. Typically, a turbulent jet exit velocity profile is flat across the radius, reducing to zero at the edge due to the presence of the nozzle. This high velocity jet suppresses the thermal boundary layer at the heat transfer surface, resulting in high heat transfer coefficients.

Microjets and microjet arrays can also provide higher heat transfer coefficients than other single or multi-phase technologies while eliminating the need for any low conductance thermal interface materials, which degrade overall thermal performance.

Additionally, microjet arrays can be located closer to the electrically active region of the device than other thermal management systems and, in many cases, may be integrated into the fabrication process of the devices.

For particularly sensitive circuitry, single-phase microjets also offer a continuous phase. This may help to minimize possible transient effects on nearby circuits from sharp discontinuities in permittivity. Single-phase systems also lessen the density difference between microjets and surrounding fluid, making them more robust against changes in orientation or incident inertial accelerations than two-phase (e.g., boiling) systems. The present disclosure focuses on single-phase techniques, but is compatible with two-phase fluidic heat transfer systems as well.

Figure 1:
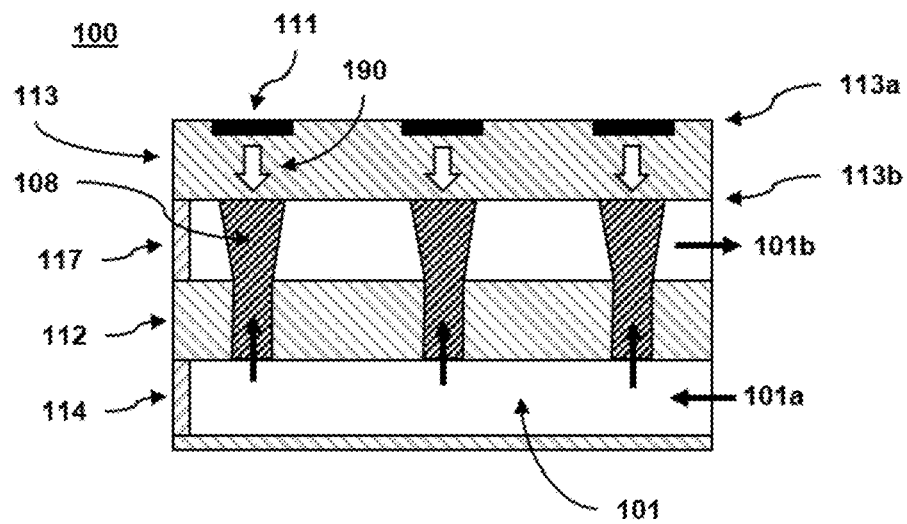
FIG. 1 shows a cross sectional view of a prior art standard embodiment of microjet cooling, a high power thermal management solution.

FIG. 1 shows an embodiment of a prior-art standard stackup 100 for cooling high power-density electronic elements using microjet impingement cooling. The electronics layer 113 contains at least one high power electronic element 111 that requires thermal management to maintain temperatures at a level that is safe for long-term operation. The electronic element 111 may be formed on or in a substrate, such as silicon, gallium nitride, gallium arsenide or others. A single-phase fluid 101 enters the stackup 100 at an inlet 101a, providing access to the manifold layer 114 to distribute the fluid to the proximity of electronic elements. The fluid 101 in manifold layer 114 is directed through a nozzle layer 112, causing high velocity microjets 108 to impinge upon the impinging surface 113b of the electronics layer 113. Note that in FIG. 1 there appears to be a single microjet 108 for each electronic element 111, but there may be arrays of microjets for single electronic elements. The microjets 108 impinge directly on surface 113b, offering high heat transfer capability via microjet impingement cooling, with the direction of heat flow shown by the arrows 190. The fluid then turns and is routed through the microjet layer 117, eventually exiting the stackup at outlet 101b.

Microjet cooling produces world-class heat transfer coefficients (heat transfer coefficient ≈200,000 W/m²° C., cf, standard liquid cold plates ≈2,000 W/m²° C.), which are best applied to high power-density electronic elements. When a significant amount of heat is deposited in a relatively small area, high heat transfer coefficients allow the heat to be removed effectively and therefore reduce component temperatures. Their higher performance requires a reduced size scale and increased input power cost, which makes them a good choice for high power-density electronics with small size scales.

Figure 2:
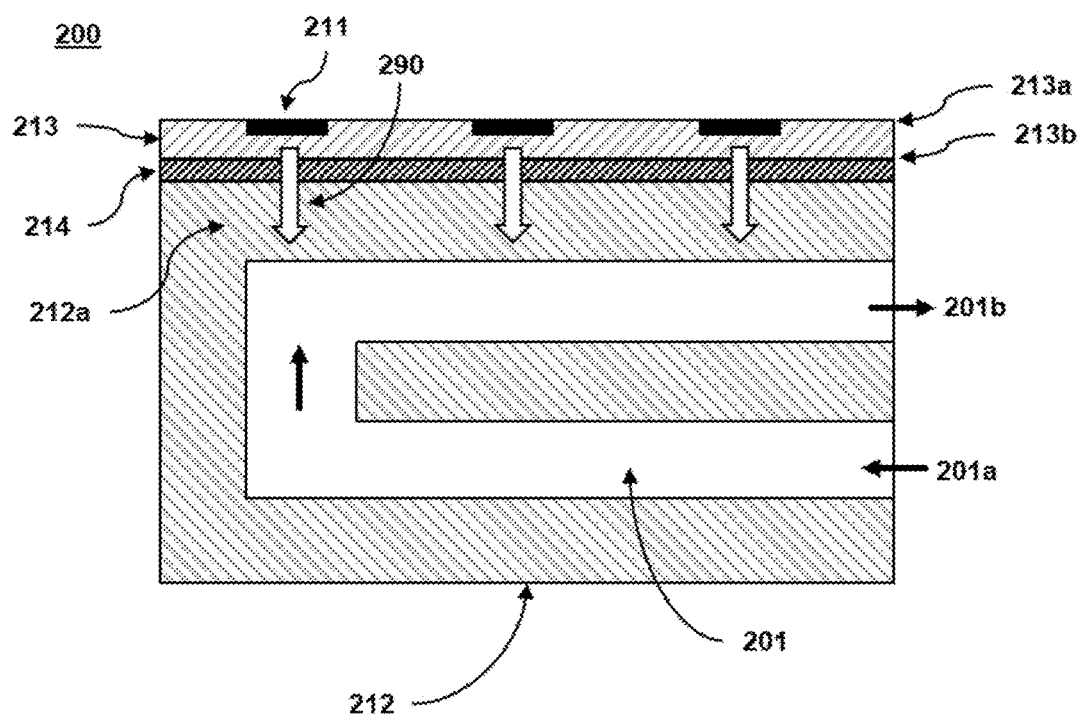
FIG. 2 shows a cross sectional view of a prior art standard embodiment of a cold plate/microchannel solution, a lower power thermal management solution.

Lower power-density electronic elements do not require such high heat transfer coefficients, and therefore typically elect to use a separate thermal management solution, as shown in FIG. 2. A standard solution 200 for cooling lower power-density electronic elements 211 contains a layer 213 of lower power-density electronic elements 211 which require thermal management. A cooling structure 212, which could be channel-based (cold plate, microchannel, etc.), or conduction based (finned heat sink, metal block, etc.) is attached to the bottom surface of the electronics layer 213b via bonding, thermal epoxy, or other thermal interfaces 214. A fluid 201, which could be single-phase or multiphase, enters the cooling structure at an inlet 201a, travels through the cooling structure 212, and exits the cooling structure at an outlet 201b. As the fluid travels through the cooling structure, heat from the lower power-density elements 211 travels through the electronics layer 213, across the thermal epoxy 214, and through the upper part of the cooling structure 212a, eventually arriving at the fluid 201 to remove heat, as illustrated by the arrows 290 indicating direction of heat flow.

Applying the thermal solution 200 results in a reduced input power cost compared to microjet cooling 100, as the heat transfer performance benefits from microjet cooling are largely unnecessary for these lower power-density elements. However, it can also result in a space inefficient total thermal management solution, such as when two separate thermal management systems (which are not spatially integrable) (e.g., as shown in FIGS. 1 and 2) are applied for different power-density elements.

To address this inefficiency, in the present disclosure lower power-density electronic elements are integrated into (i.e., co-located with) the microjet nozzle layer to perform microjet nozzle cooling. As will be described in the following paragraphs, this will serve to integrate lower power-density electronics into existing microjet stackups to eliminate the need for separate lower power thermal management hardware, greatly reducing total system size.

FIG. 1 shows a standard microjet impingement cooling stackup. In microjet impingement cooling, the only layer to be cooled (electronics layer 113) is that being impacted by the high velocity jets (113), which contains high power-density electronics. Generating these high velocity jets requires the fluid to pass through a nozzle 112 in order to generate the high velocity. Upon exiting, the jets impinge upon the high power-density elements' substrate, producing extremely high heat transfer capability (heat transfer coefficient ≈200,000 W/m²° C.).

However, before reaching the high power-density elements' substrate, as the fluid passes through the nozzles, it still has a high heat transfer capability (heat transfer coefficient ≈5,000-20,000 W/m²° C.). This potential currently goes unused. By co-locating lower power-density electronics with the microjet nozzles in the nozzle layer, heat can be removed from these lower power-density components and transferred to the fluid as it passes through the nozzles, via a process termed "microjet nozzle cooling."

Put another way, the only function of the nozzle layer in current microjet systems is to generate the high velocity jets which provide microjet impingement cooling on the high-power surface that is separate from the nozzle layer. The present disclosure expands the function of the microjet nozzle layer to provide microjet nozzle cooling for lower power-density elements by collocating the nozzles within the lower power-density substrate.

Figure 3:
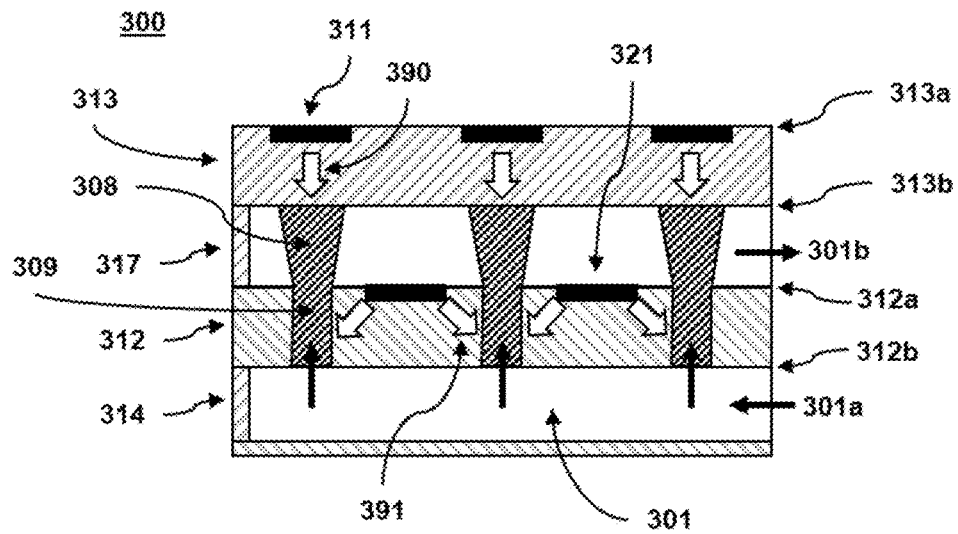
FIG. 3 shows a cross sectional view of one embodiment of the present disclosure, where lower power-density electronics are integrated into the microjet nozzle layer to perform both microjet nozzle cooling of lower power-density elements and microjet impingement cooling of higher power components.

FIG. 3 shows one embodiment of the present disclosure, wherein a stackup 300 contains co-located electronic elements and microjet nozzles. The electronics layer 313 contains at least one high power electronic element 311 that needs thermal management to keep temperatures down for safe and long-term operation. The combined nozzle electronics layer 312 contains at least one lower power-density electronic element 321 that needs thermal management to keep temperatures down for safe and long-term operation, but may contain other components that do not require thermal management. A single-phase fluid 301 enters the stackup 300 at an inlet 301a, providing access to the manifold layer 314 to distribute the fluid to the proximity of electronic elements. The fluid 301 in manifold layer 314 is directed through a combined nozzle electronics layer 312 containing at least one lower power-density electronic element 321 and at least one passage of fluid through a nozzle 309. As the fluid 301 goes through the combined nozzle electronics layer 312, microjet nozzle cooling of lower power density elements 321 occurs. Heat from lower power-density elements 321 travels through the combined nozzle electronics layer 312 into the fluid going through the nozzle 309, with the direction of heat flow shown by arrows 391. Upon exiting the nozzle, high velocity microjets 308 impinge upon the impinging surface 313b of the electronics layer 313. The microjets 308 impinge directly on surface 313b, offering high heat transfer capability of higher power density elements 311 via microjet impingement cooling, with the direction of heat flow shown by the arrows 390. The fluid then turns and is routed through the microjet layer 317, eventually exiting the stackup at outlet 301b.

Note that in FIG. 3 there appears to be a single microjet 308 for each electronic element 311, but there may be arrays of microjets for single electronic elements. There also appears to be lower power-density electronic elements 321 co-located only in between two microjet arrays 308; the lower power-density electronic elements 321 can be co-located anywhere on the combined nozzle electronics layer 312. While lower power-density electronic elements 321 will be cooled more effectively the closer they are to nozzle fluid flows 309, the lower power-density electronic elements 321 and the combined nozzle electronics layer 312 will be cooled by microjet nozzle cooling independent of this distance. For example, very low power-density elements need not be anywhere close to the nozzle fluid flows 309 to be cooled effectively. There may be a great multitude of lower power-density elements 321 on the nozzle layer, for example, many more than the number of nozzle flows 309. The arrows 391 denoting the direction of heat flow show heat going at a roughly 45° angle from the lower power-density element 321 toward the nozzle fluid flows 309; the net heat flow may be in any direction toward the nozzle fluid flows 309.

FIG. 3 also shows the low power-density electronic elements 321 in contact with fluid in the microjet layer 317. This need not be the case and other instantiations may, of course, be used where, for example, the low power-density electronic elements do not contact the fluid or microjet layer 317 but still receive cooling through conduction of the combined nozzle electronics layer 312 and fluid going through the nozzle 309.

The electronics layer 313 is typically a semiconductor component, which includes at least one electronic function or circuit. The electronics layer 313 may be made out of silicon, gallium nitride, gallium arsenide or other materials. The high power-density electronic elements 311 may comprise one or more electronic circuits, such as transistors, FETs, and other semiconductor functions. The high power-density electronic elements 311 need not be located on the top surface 313a; they may be located anywhere within the electronics layer substrate 313, for example, on surface 313b.

The impinging surface 313b may be smooth and featureless or may have enhancing features added. These include, but are not limited to, features to enhance surface area, and/or features to alter fluid flow to promote enhanced heat transfer or fluid routing. Such features may include ribs, microstructures, cavities, pillars, or any other feature type. These features may extend from the impinging surface 313b into the microjet layer 317, either partially, or fully all the way to surface 312a of the combined nozzle electronics layer 312. Features that extend fully may contain conduits that serve as pathways for electrical connections, electromagnetic waves, or light. Full-length features may also serve as structural agents.

The combined nozzle electronics layer 312 may be any material, for example, metal, plastic, or semiconductor. The combined nozzle electronics layer 312 will offer more effective microjet nozzle cooling if it is made of a high thermal conductivity material, such as a metal, but will still provide cooling if the material is of low thermal conductivity. The thickness of the combined nozzle electronics layer 312 is carefully chosen to balance pressure drop, heat transfer, and structural integrity, but may be, for example, around 500 μm. The lower power-density electronic elements 321 may comprise one or more electronic circuits, such as transistors, FETs, resistors, capacitors, and other electrical functions. The lower power-density electronic elements 321 need not be co-located on the surface at the nozzle exit 312a; they may be located anywhere within the combined nozzle electronics layer 312, for example, on surface 312b.

In operation, a single-phase fluid 301 is administered. This fluid may be any suitable coolant, including air, water, ethylene glycol, propylene glycol, ethanol, R134A, ammonia, or any other fluid. A combination of two or more of these fluids may also be used. Liquid-tight seals of any type may be formed between layers containing fluid, which may include the use of epoxies, gaskets, soldering, bonding, or any other suitable method.

The inlet 301a and outlet 301b may be of any type. They may, for example, provide transmission to/from other components that require cooling. Such other components may be in neighboring parts of the stackup or may require transmission via tubing to other parts of the system. They may interface with a fitting (e.g. barb, quick disconnect, compression), tubing, a manifold, or any other suitable method of interfacing fluids.

In another set of embodiments, collocating microjet nozzles with electronic elements can save space and enhance cooling in three-dimensional (3D) integrated electronic stackups.

Current trends in electronics packaging point towards continual miniaturization of package sizes to achieve greater functionality in a smaller footprint. Current fabrication processes locate electronics on a single layer of a thin substrate (e.g. silicon), where electronics are arranged side-by-side in a single plane. In order to add functionality to such a traditional electronics substrate, the substrate must be made larger.

Figure 4:
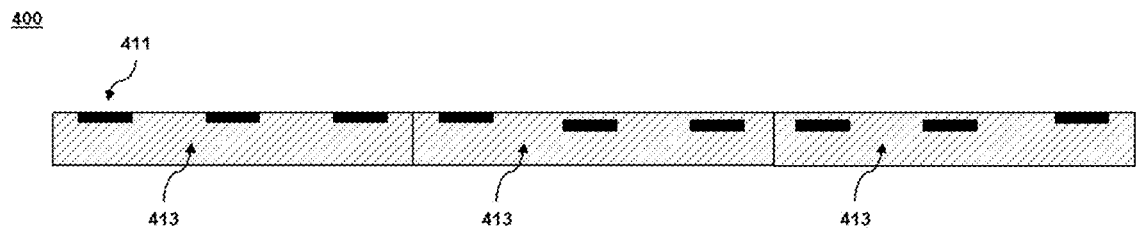
FIG. 4 shows a cross sectional view of standard electronic element layouts.

Traditional electronics packaging is shown in FIG. 4. The full electronic assembly 400 consists of multiple electronics components 411, which standard fabrication techniques locate side by side in the same plane. As an example illustration, the full assembly 400 consists of three electronics dies 413 each with three electronic elements 411.

To achieve more compact packages, 3D integration was introduced, with goals of stacking electronics layers in the out-of-plane direction (i.e. growing upward instead of outward). This strategy takes advantage of the planar compactness of existing electronics by making the package size only marginally thicker in the out-of-plane (upward) direction, with minimal change in the planar (outward) footprint.

Figure 5:
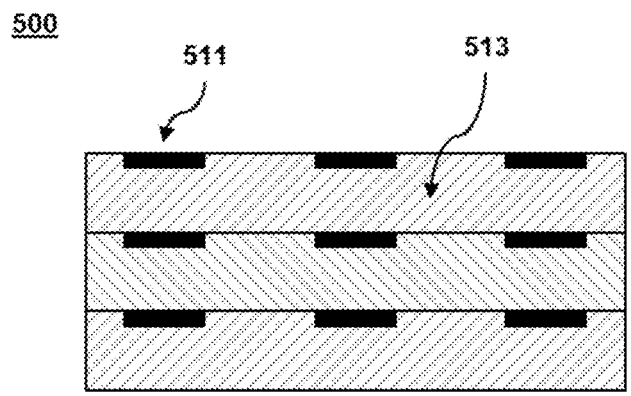
FIG. 5 shows a cross sectional view of a three dimensional (3D) integrated electronic element layout.

3D integrated electronic packaging is shown in FIG. 5. The full electronic assembly 500 consists of a multilayered stackup, each with at least one electronic element 511. In this example, by stacking each electronics die 513, each with three electronic elements 511, the overall footprint of the overall electronics die or package 500 is reduced, making for a more compact overall package.

A key challenge of 3D integration is the thermal management of the high power-density electronic elements that have now become buried within the stackup. In standard electronics designs 400, there is direct thermal access to the electronic elements on the top or bottom of the substrate, since there is only a single layer. However, by stacking layers of electronics on top of each other in a 3D integrated package 500, thermal access to the electronic elements becomes blocked by each subsequent layer, diminishing thermal performance as the high power-density elements are positioned farther from the thermal management solution. Moreover, standard thermal solutions are often bulky in size and extend beyond the device footprint, making thermal management in 3D stacks very difficult.

In response to this challenge, high-performance cooling methods like microjet cooling have been proposed to be integrated as intermediate layers of the 3D integrated solution, incorporating direct thermal access between electronics layers without increasing the planar footprint.

Figure 6:
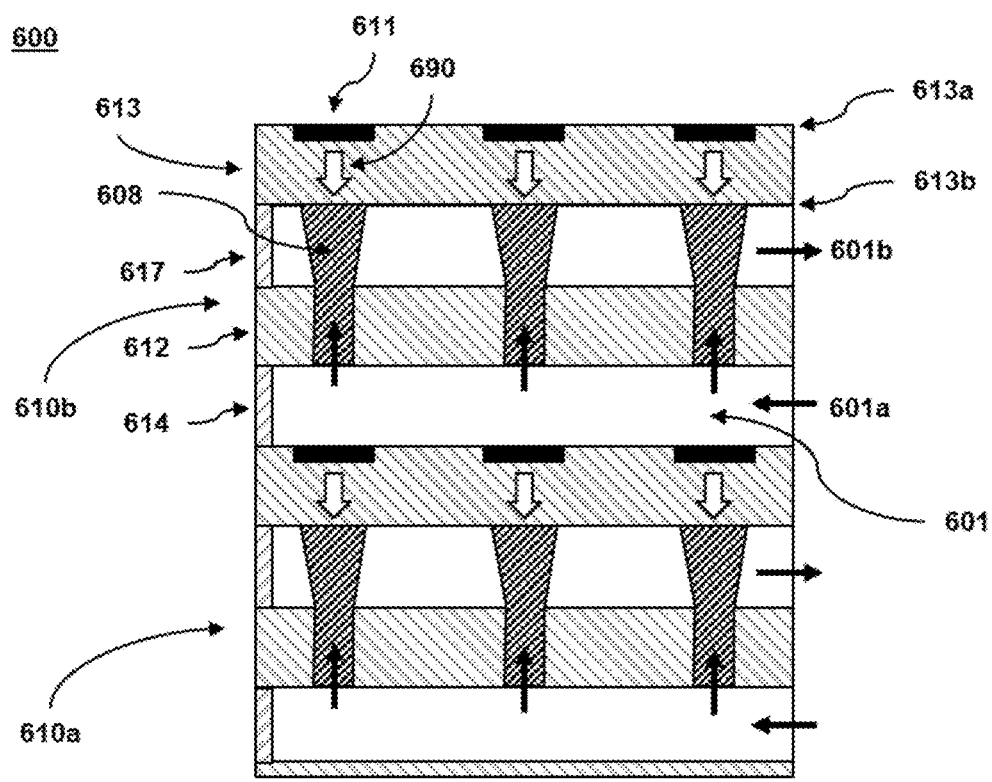
FIG. 6 shows an exemplary prior art microjet impingement implementation in 3D integrated stackups.

A prior art embodiment of microjet cooling in 3D integrated stackups is shown in FIG. 6. A 3D integrated stackup 600 contains two separate but identical electronics microjet stackups, 610*a* and 610*b*. Both electronics microjet stackups 610*a* and 610*b* contain a layer of electronics 613. The electronics layers 613 contain at least one high power electronic element 611 that needs thermal management to maintain temperatures that are safe for long-term operation. A single-phase fluid 601 enters the electronics microjet stackups 610*a* and 610*b* at inlets 601*a*, providing access to the manifold layers 614 to distribute the fluid to the proximity of electronic elements. The single-phase fluid 601 in manifold layers 614 is directed through nozzle layers 612, causing high velocity microjets 608 to impinge upon the impinging surfaces 613*b* of the electronics layers 613. Note that in FIG. 6 there appears to be a single microjet 608 for each electronic element 611, but there may be arrays of microjets for single electronic elements. The microjets 608 impinge directly on surfaces 613*b*, offering high heat transfer capability via microjet impingement cooling, with the direction of heat flow shown by the arrows 690. The single-phase fluid 601 then turns and is routed through the microjet layers 617, eventually exiting the electronics microjet stackups at outlets 601*b*.

FIG. 6 essentially shows two identical electronics microjet cooling stackups 610*a* and 610*b* stacked on top of each other. Each electronics layer 613 requires three layers of thermal management, the manifold layer 614, the nozzle layer 612, and the microjet layer 617, in order to provide thermal management. While this layout provides high-performance cooling in a 3D integration compatible form factor, it results in a thick stackup with many layers to be fabricated and integrated.

This disclosure, therefore, introduces co-locating microjet nozzles with electronic elements into multilayered electronics stackups. As will be discussed in the following paragraphs, this will serve to reduce thickness in 3D integrated electronic stackups with microjets by consolidating layers and provide enhanced thermal management via microjet nozzle cooling.

Figure 7:
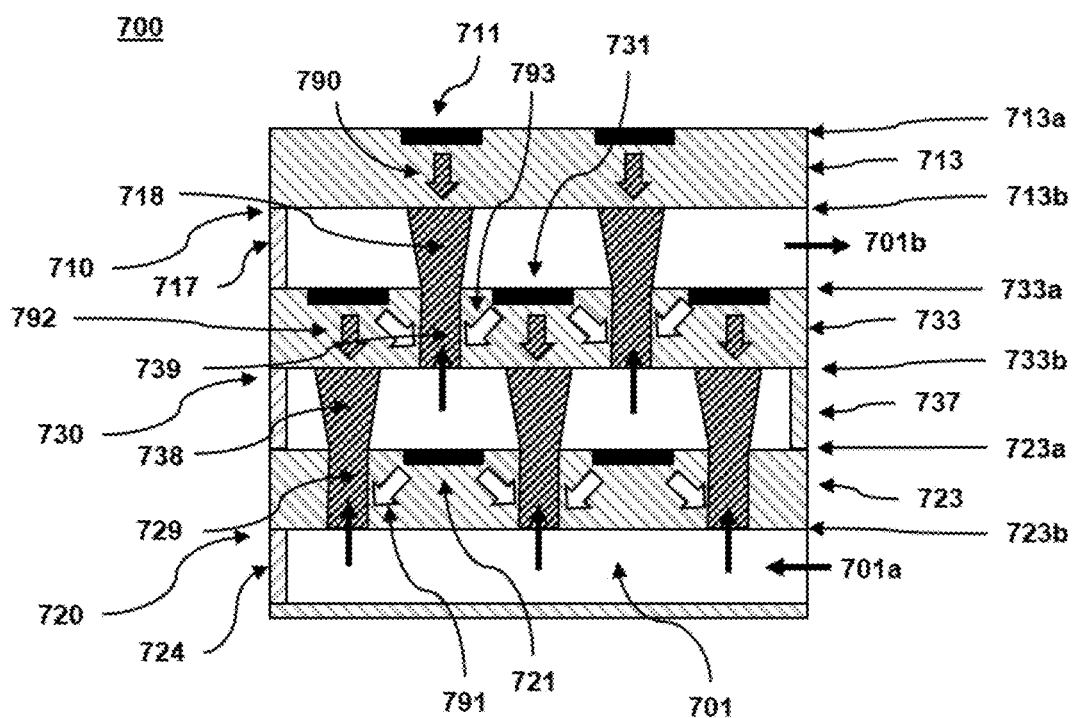
FIG. 7 shows an embodiment of the present disclosure, implementing a 3D integrated stackup where microjet nozzles are co-located with stacked electronics layers to create a compact, high performing 3D integrated stackup with microjet cooling.

FIG. 7 shows an embodiment of co-located microjet nozzles with electronic elements on a multilayered electronics stackup. A 3D integrated stackup 700 contains three separate and unique electronics microjet stackups, 720, 730, and 710.

The electronics microjet stackup 720 contains a combined nozzle electronics layer 723. The combined nozzle electronics layer 723 contains at least one lower power-density electronic element 721 that needs thermal management to keep temperatures down for safe and long-term operation, but may contain other components that do not require thermal management. A single-phase fluid 701 enters the stackup 720 at an inlet 701*a*, providing access to the manifold layer 724 to distribute the fluid to the proximity of electronic elements. The fluid 701 in manifold layer 724 is directed through a combined nozzle electronics layer 723 containing at least one lower power-density electronic element 721 and at least one passage of fluid through a nozzle 729. As the fluid 701 goes through the combined nozzle electronics layer 723, microjet nozzle cooling occurs. Heat from lower power-density elements 721 travels through the combined nozzle electronics layer 723 into the fluid going through the nozzles 729, with the direction of heat flow shown by arrows 791. The fluid exits stackup 720 out of the nozzles 729 and feeds into the combined microjet manifold layer 737 in stackup 730.

The electronics microjet stackup 730 contains a combined nozzle electronics layer 733. The combined nozzle electronics layer 733 contains at least one electronic element 731 that needs thermal management to keep temperatures down for safe and long-term operation, but may contain other components that do not require thermal management. A single-phase fluid 701 enters the stackup 730 from the liquid in the nozzles 729 of combined nozzle electronics layer 723 in stackup 720. The single-phase fluid impinges upon the impinging surface 733*b* of the combined nozzle electronics layer 733 in high velocity microjets 738. The microjets 738 impinge directly on impinging surface 733*b* via combined microjet manifold layer 737, offering high heat transfer capability via microjet impingement cooling, with the direction of heat flow shown by the arrows 792. The fluid 701 in combined microjet manifold layer 737 is directed through a combined nozzle electronics layer 733 containing at least one electronic element 731 and at least one passage of fluid through a nozzle 739. As the fluid 701 goes through the combined nozzle electronics layer 733, microjet nozzle cooling occurs. Heat from electronic elements 731 travels through the combined nozzle electronics layer 733 into the fluid going through the nozzles 739, with the direction of heat flow shown by arrows 793. The fluid exits stackup 730 out of the nozzles 739 and feeds into the microjet manifold layer 717 in stackup 710.

The electronics microjet stackup 710 contains an electronics layer 713. The electronics layer 713 contains at least one electronic element 711 that needs thermal management to keep temperatures down for safe and long-term operation. A single-phase fluid 701 enters the stackup 710 from the liquid in the nozzles 739 of combined nozzle electronics layer 733 in stackup 730. The single-phase fluid impinges upon the impinging surface 713*b* of the electronics layer 713 in high velocity microjets 718. The microjets 718 impinge directly on impinging surface 713*b* via combined microjet layer 717, offering high heat transfer capability via microjet impingement cooling, with the direction of heat flow shown by the arrows 790. The fluid 701 then turns and is routed through the microjet layer 717, eventually exiting the stackup at outlet 701*b*.

Note that in FIG. 7 there appears to be a single microjet for each electronic element; there may be arrays of microjets for single electronic elements. There also appears to be lower power-density electronic elements co-located only near microjet arrays; the lower power-density electronic elements can be co-located anywhere on the combined nozzle electronics layers. While electronic elements will be cooled more effectively the closer they are to nozzle fluid flows, the electronic elements and the combined nozzle electronics layers will be cooled by microjet nozzle cooling independent of this distance. For example, very low power-density elements need not be anywhere close to the nozzle fluid flows to be cooled effectively. There may be a great multitude of lower power-density elements in each combined nozzle electronics layer, for example, many more than the number of nozzle flows. The arrows 791 denoting the direction of heat flow show heat going at a roughly 45° angle from the electronic elements toward the nozzle fluid flows; the net heat flow may be in any direction 791 toward the nozzle fluid flows. There need not be any sort of pattern of electronic elements/microjets as may be implied by FIG. 7. Electronic elements may be situated anywhere on their respective layers, with the only requirement being a nozzle in the proximity opposite them for impingement of a microjet array on/near the high power-density electronic elements.

In the 3D integrated stackup 700, there are three unique cooling patterns. The first, in electronics layer 713 in stackup 710, electronic elements 711 are cooled only via microjet impingement cooling, as indicated by heat flow arrows 790. The second, in combined nozzle electronics layer 723 in stackup 720, electronic elements 721 are cooled only via microjet nozzle cooling, as indicated by heat flow arrows 791. The third, in combined nozzle electronics layer 733 in stackup 730, electronic elements 731 are cooled via both microjet impingement cooling and microjet nozzle cooling as indicated by heat flow arrows 790 and 791 respectively.

The electronic elements 711, 721, and 731 in the example 3D integrated stackup 700 may be of different types.

Electronic elements 721 are unlikely to be the highest power-density elements, as only microjet nozzle cooling provides thermal management for them.

Electronic elements 711 may be high power-density elements, as they can be situated under microjet or microjet arrays. They may also be lower power-density elements, as microjet impingement cooling can support both high and lower power-density elements, though is more effectively applied for high power-density elements.

Electronic elements 731 may be high or lower power-density, similar to electronic elements 711. However, because an electronic element can be positioned such that it is cooled via both microjet impingement and microjet nozzle cooling, an even higher power-density element may be administered in a nozzle layer situated with a microjet impinging upon it. Similarly, lower power-density elements may be situated only near a nozzle and not a microjet.

In layers 713 and 733, there may be a mix of electronic elements, both high and lower power density. There may be a mix within the same layer, with any number of high power-density elements being combined with any number of lower power-density elements. High power-density elements should be in proximity of a microjet or microjet array, while lower power-density elements may be located anywhere within the layer.

Further, because of the co-located nozzles in the electronics layers, many layers from the standard implementation in FIG. 6 have been removed to reduce thickness. Because the interior nozzle layer 612 in stackup 610b and the interior electronics layer 613 of stackup 610a are effectively merged, a separate nozzle layer for each electronics layer is no longer needed and thickness is reduced. Additionally, because the interior microjet layer 617 of stackup 610a and the interior manifold layer 614 of stackup 610b are effectively merged, a separate manifold layer for each electronics layer is no longer needed and thickness is reduced.

Figure 8:
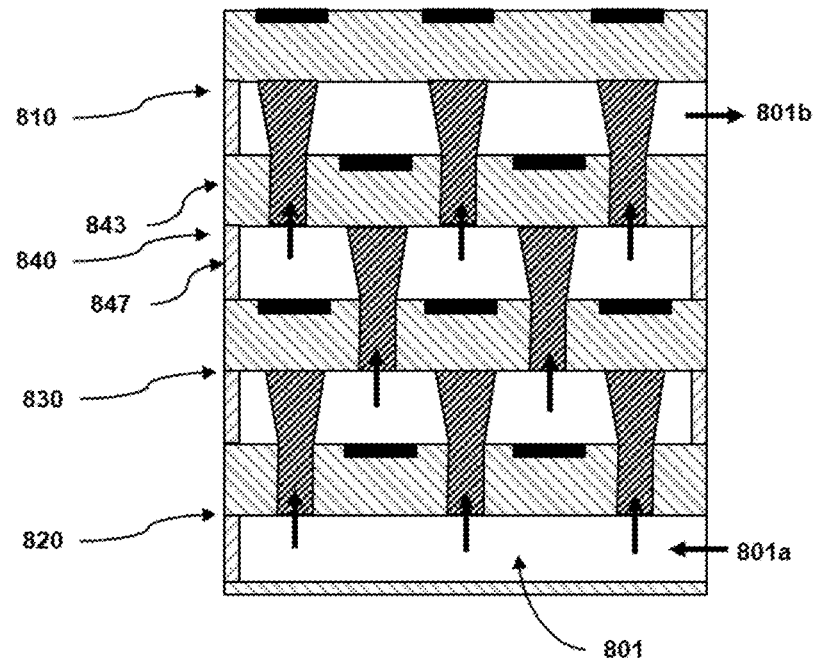
FIG. 8 shows another embodiment of the present disclosure, where an additional microjet electronic cooling layer is added to show the scalability and modularity of the present disclosure.

Although in this embodiment three layers of electronics are shown, there may be any number of electronics layers in a 3D electronics stack up. For example, as shown in FIG. 8, there could be a 3D integrated stackup 800 with an additional microjet electronics stackup 840 added, containing a combined nozzle electronics layer 843 and a combined microjet manifold layer 847, to make for four total electronics layers. In other embodiments, more electronics layers may exist.

Figure 9:
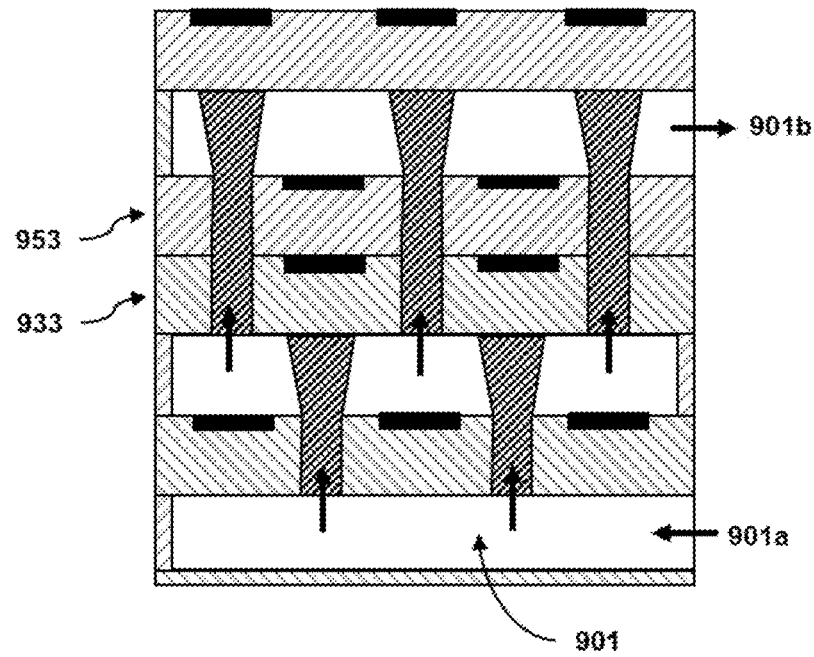
FIG. 9 shows another embodiment of the present disclosure, where two electronics layers are stacked consecutively to show the flexibility in the distribution of electronics layers and thermal management layers in 3D integrated stackups.

Additionally, each electronics layer need not have its own layer of thermal management associated with it. FIG. 9 shows an embodiment where two electronics layers 933 and 953 are stacked consecutively in the interior of the 3D integrated stack 900. Fluid 901 enters via inlet 901a, passes through one set of microjets as described previously, and then passes consecutively through two combined nozzle electronics layers 933 and 953, before exiting at outlet 901b. In this embodiment, combined nozzle electronics layer 933 may contain high power-density electronic elements cooled by microjet impingement cooling and microjet nozzle cooling, while combined nozzle electronics layer 953 may contain lower power-density electronics cooled only by microjet nozzle cooling.

The thickness of layers 933 and 953 need not be the same as each other or as other layers in the stackup. For example, it may be advantageous for stacked layers 933 and 953 to be thinner than non-stacked layers in this or other embodiments to facilitate more consistent fluid flow. In general, across all embodiments, stacked and non-stacked layers need not be of uniform thickness.

Figure 10:
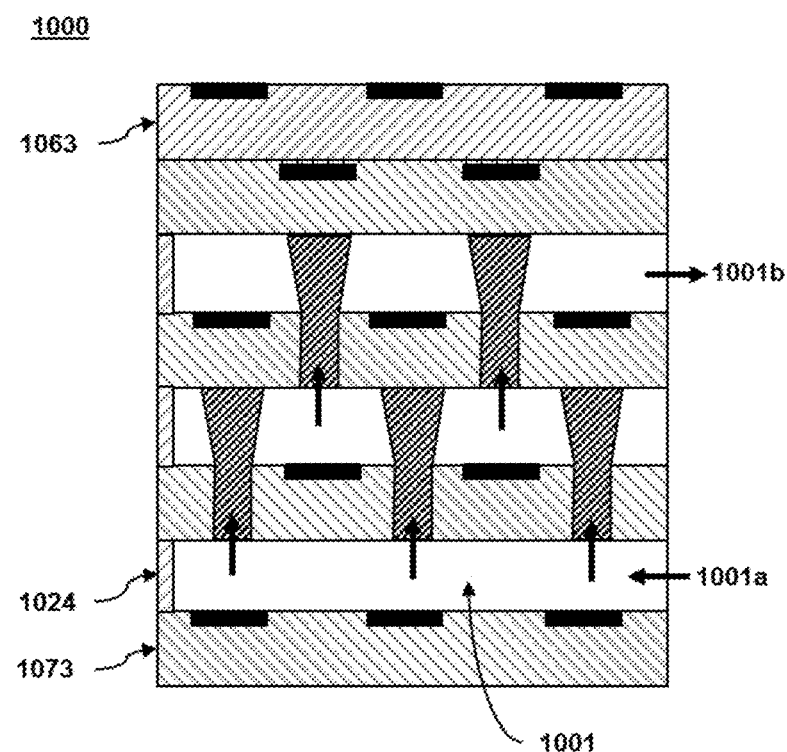
FIG. 10 shows another embodiment of the present disclosure, where electronics layers that may not need thermal management are stacked on the exterior of the 3D integrated solution, adding functionality to the 3D integrated stackup.

In another embodiment, electronics layers may be added to the exterior of the 3D integrated stackup, as shown in FIG. 10. In this embodiment, the electronics layer 1063 may not need any thermal management, and thus may be added without risk to the exterior where there is no cooling from the fluid 1001 available. Electronics layer 1073 may have very low power-density elements, where the proximity to the very low flow of the manifold layer 1024 can provide limited cooling.

Referring back to FIG. 7, The electronics layers possibly containing high power electronics 713 and 733 may typically be semiconductor components, which include at least one electronic function or circuit. The electronics layers 713 and 733 may be made out of silicon, gallium nitride, gallium arsenide or other materials. The high power-density electronic elements may comprise one or more electronic circuits, such as transistors, FETs, and other semiconductor functions. The high power-density electronic elements need not be co-located on the top surfaces 713a and 733a; they may be located anywhere within the electronics layer substrates 713 and 733, for example, on surfaces 713b and 733b.

The impinging surfaces 713b and/or 733b may be smooth and feature-less or may have enhancing features added. These include, but are not limited to, features to enhance surface area, and/or features to alter fluid flow to promote enhanced heat transfer or fluid routing. Such features may include ribs, microstructures, cavities, pillars, or any other feature type. These features may extend from, for example, the impinging surface 713b into the microjet layer 717, either partially, or fully, all the way to surface 733a of the combined nozzle electronics layer. Features that extend fully may contain conduits that serve as pathways for electrical connections, electromagnetic waves, or light. In 3D integrated structures, these conduits may be especially useful for electronic signals between elements on different layers. Full-length features may also serve as structural agents.

The electronics layers that only contain lower power-density electronics may be any material, for example, metal, plastic, or semiconductor. The layer will offer more effective microjet nozzle cooling if it is made of a high thermal conductivity material, such as a metal, but will still provide cooling if the material is of low thermal conductivity. The thickness of the layer is carefully chosen to balance pressure drop, heat transfer, and structural integrity, but may be, for example, around 500 µm. The lower power-density electronic elements may comprise one or more electronic circuits, such as transistors, FETs, resistors, capacitors, and other electrical functions. The lower power-density electronic elements need not be co-located on the upper surface; they may be located anywhere within the combined nozzle electronics layer, for example, on the lower surface.

The thickness of the combined nozzle electronics layers 723 and 733 is carefully chosen to balance pressure drop, heat transfer, and structural integrity, but may be, for example, around 500 µm.

In operation, a single-phase fluid 701 is administered. This fluid may be any suitable coolant, including air, water, ethylene glycol, propylene glycol, ethanol, R134A, ammonia, or any other fluid. A combination of two or more of these fluids may also be used. Liquid-tight seals of any type may be formed between layers containing fluid, which may include the use of epoxies, gaskets, soldering, bonding, or any other suitable method.

The inlet 701a and outlet 701b may be of any type. They may, for example, provide transmission to/from other components that require cooling. Such other components may be in neighboring parts of the stackup, or in another embodiment, may require transmission via tubing to other parts of the system. They may interface with a fitting (e.g. barb, quick disconnect, compression), tubing, a manifold, or any other suitable method of interfacing fluids.

The disclosure also allows for the same fluid to be used to cool each layer in a compact, integrated fashion. In the baseline shown in FIG. 6, the fluid needs to exit out of the microjet layer into a fitting or another manifold, which takes up space and adds complexity. However, FIG. 7 shows that the fluid can directly enter the subsequent nozzle layer without any complex routing required. This results in fewer inlet/outlet ports to reduce system size and complexity, and more economized use of the fluid flow for system-level improvement.

To summarize some of the 3D integrated embodiments, there are novel benefits yielded from employing co-located microjet nozzles and electronic elements. The first is the enhanced heat transfer capability, as electronic elements of even higher powers can be administered due to the combined effect of microjet nozzle cooling and microjet impingement cooling on the same layer. The second is the substantial space savings that can be achieved. Because a separate nozzle plate is not required to generate high velocity microjets for subsequent layers, two layers can be merged into one to reduce the thickness of the stackup. Additionally, because the microjets need not exit the stackup and can directly enter into the nozzles of the subsequent layer, the microjet layer of one cooling layer can be merged with the manifold layer of the subsequent cooling layer, further reducing the thickness of the stackup. Comparing FIG. 6 and FIG. 7, for example, a standard stackup would require up to nine layers to administer thermal management for three separate layers of electronics, whereas the stackup with co-located nozzles only requires up to three.

Features may also be added to the orifice cross section to enhance microjet nozzle cooling.

The standard embodiment of microjet impingement cooling involves smooth orifices for the fluid to pass through and generate microjets. Oftentimes in thermal management systems, heat transfer enhancing features are added to surfaces to either enhance the area or improve the fluid flow. Since the nozzle has not typically been used as a heat transfer mechanism, there has been no reason to add features inside of the nozzles, as it was viewed as only adding cost and complexity to the microjet system.

Figure 11:
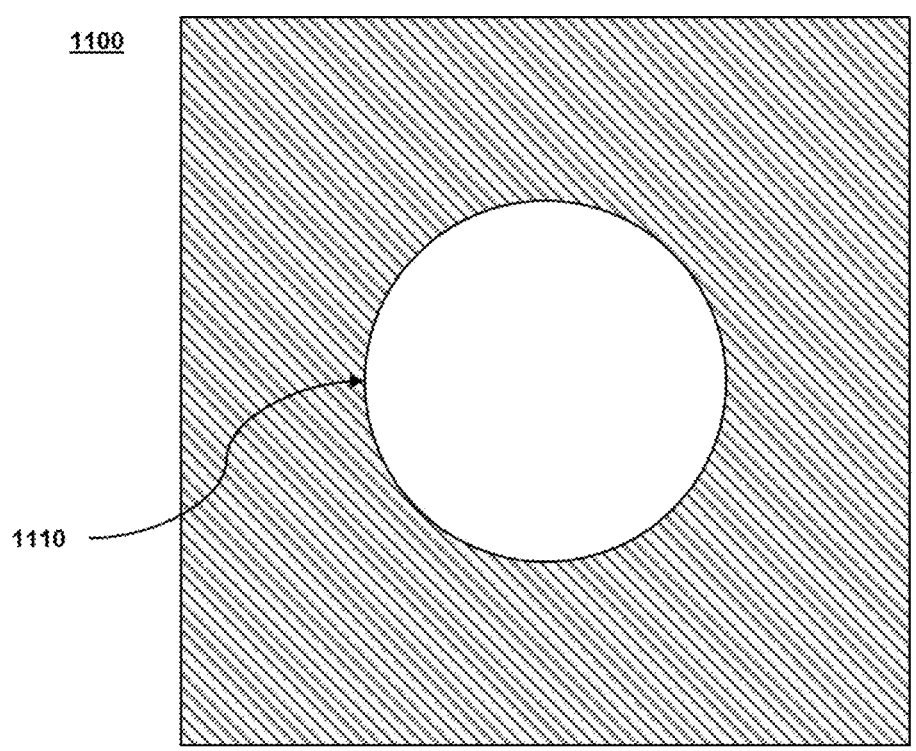
FIG. 11 shows a top view of an embodiment of a smooth nozzle, which can be used for microjet impingement cooling.

FIG. 11 shows an embodiment of a standard microjet cooling nozzle in cross section. The substrate 1100 contains smooth orifices 1110 of any shape (e.g. circular, square, triangular, etc.). The size of orifice 1110 is carefully chosen to appropriately balance heat transfer capability and pressure drop, but may be, for example, less than 200 µm in diameter. Different nozzles in an array of microjets need not all be of uniform size or shape.

However, when nozzles are being used for microjet nozzle cooling, adding heat transfer enhancing features within the nozzles improve the heat transfer capability of the resulting system. Therefore, to further enhance the heat transfer capability of the fluid traveling through the nozzles, features may be added within the nozzles that either enhance the area of the nozzles or alter the fluid dynamics for improved heat transfer flow. This would allow placement of electronic elements with power densities higher than what standard, smooth nozzles could support.

FIG. 12 shows a single embodiment of an enhanced nozzle for microjet nozzle cooling in cross section. The substrate 1200 contains an enhanced nozzle 1210, which contains features 1220. Features 1220 can have any size and/or shape. There can be one or more such features in a nozzle cross section. The features can disrupt the otherwise circular cross section of the nozzle. The features can increase nozzle surface area and/or alter the fluid flow through the nozzle (e.g., making the fluid flow more turbulent in order to reduce boundary layer effects). The overall size of the nozzles 1210 is carefully chosen to appropriately balance heat transfer capability and pressure drop, but may be, for example, less than 200 µm. The size of features 1220 is carefully chosen to appropriately balance heat transfer capability and pressure drop, but may be, for example, $1/10^{th}$ the size of the overall nozzle. The shape of nozzles is carefully chosen to increase area and/or alter fluid flow for enhanced heat transfer, but may be, for example, rectangular, triangular, helical, trapezoidal, or any other shape based on considerations of heat transfer enhancement and pressure drop. The number and distribution of features are carefully chosen to increase area and/or alter fluid flow for enhanced fluid flow in conjunction with the feature sizes. Although a single cross section is shown, the entire nozzle need not have the same cross section.

FIGS. 13A and 13B show another embodiment of an enhanced nozzle, where a jet nozzle plate (1301) of thickness (1302) has an array of microjet nozzles (1303). By taking a cross section of the nozzle plate (1301), as in FIG. 13B, the nozzle shape becomes visible. By including a chamfered edge (1304) on the inlet side of the jet nozzles (1303), the area of the nozzle is enhanced due to the larger diameter taper. This chamfer enhances microjet nozzle cooling by increasing the area in contact with the coolant fluid, thereby causing greater heat transfer. Meanwhile, this chamfered edge may serve to have system benefits, allowing reduced pressure drop or enhanced fluid flow for microjet impingement. Note that the geometric features of the chamfer such as angle, depth, and diameter are chosen to produce an optimal desired result.

Arrays of nozzles need not have nozzles with the same design; there may be any number of nozzle types within an array of microjets. This includes, but is not limited to, some nozzles having features to alter the fluid flow, some nozzles having features to increase area, some nozzles having both, and some nozzles having no features at all.

The additional microjet nozzle cooling has minimal impact on the subsequent impingement cooling of the high power-density substrate. Maintaining the same overall hydraulic diameter of the nozzle while adding features may cause an enhanced area while having no significant impact on pressure drop and input system power. For the downstream impingement, microjet nozzles of various shapes have been employed without a notable impact on performance. Therefore, microjet nozzle cooling enhances the overall heat transfer capability of microjet cooling, with minimal system impact.

Inter-layer features may also be added between layers with electronic elements to provide advantages in structural reinforcement, fluid dynamics, heat transfer, and system integration.

Figure 14:
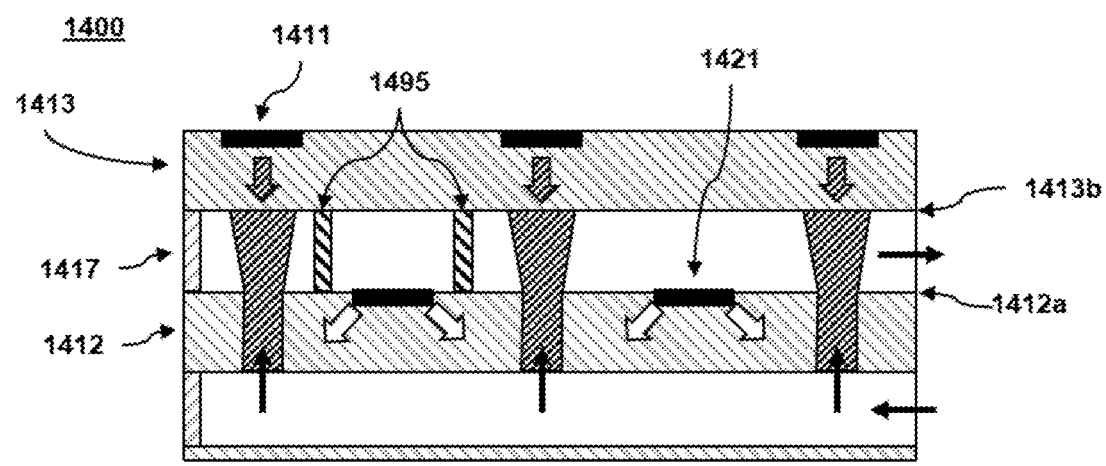
FIG. 14 shows a cross sectional view of another embodiment of the present disclosure, including inter-layer features spanning two neighboring electronic layers.

FIG. 14 shows another embodiment of the present disclosure. As in previous embodiments, there is a 3D integrated stackup comprising: a manifold layer, a nozzle layer 1412 containing at least one lower power density component 1421, a microjet layer 1417, and an electronics (impingement) layer 1413 containing at least one high power density component 1411. In this embodiment, there is also at least one inter-layer feature 1495, spanning manifold layer 1417 from lower surface 1413*b* of electronics layer 1413 to upper surface 1412*a* of nozzle layer 1412.

Inter-layer features 1495 may have a variety of uses. First, they may serve as structural members. In the case where the 3D integrated stackup 1400 is of large area, stress will be concentrated at the attachment points, which may be limited to the perimeter of the 3D integrated structure. This may be especially useful for situations described herein where pressurized fluid is passing through the structure. By adding inter-layer features, this may serve to relieve the stress at the perimeter attachment points to more evenly distribute load across the full area of the structure. Note that even in cases where attachment is not performed exclusively on the perimeter, inter-layer features can still serve to distribute the load.

Inter-layer features 1495 may also serve as thermally conductive conduits, serving to more optimally accomplish cooling of the various electronic components. The thermally conductive conduits may conduct heat to enhance either microjet impingement or microjet nozzle cooling. For example, one embodiment may involve a case where an electronic component on the impingement layer is not subject to significant fluid flow, and as such heat may be conducted via an inter-layer feature to transfer heat through a nearby microjet nozzle on the nozzle layer. In another embodiment, an electronic located on the nozzle layer may conduct heat through an inter-layer feature to an area of microjet impingement, to fully or partially remove heat from the electronic on the non-impingement layer.

Inter-layer features 1495 may also serve as fluidic routing features. It is a continual goal in microjet stackups to optimize the fluid flow to, for example, minimize pressure drop, lower required flow rate, and minimize flow disturbances in neighboring microjet impingement areas. By strategically including inter-layer features, they can serve as flow routing features to improve the fluid flow pathways and produce desired streamlines in the manifold layer.

Inter-layer features 1495 may also serve as conduits for transmission of signals from one layer to the next. For example, inter-layer features 1395 may serve to facilitate the transmission of electrical signals, optical signals, or other electromagnetic waves. This allows for interconnectivity between layers of a 3D integrated stackup. In one case, for example, a certain layer may serve as an RF communication electronics layer, while a second layer may serve as a digital electronics layer. A single inter-layer feature may provide transmission of different signals within the same inter-layer feature. Of course, proper grounding and electrical layouts must be carefully considered depending on the layer type, inter-layer feature form, and electrical requirements.

Inter-layer features 1495 may be of any shape or size to accomplish one or more of the varying functions listed. For example, the inter-layer feature could be of circular, square, octagonal, or any other shaped cross section. The inter-layer features could be between 100 μm-1 mm, or could be of other sizes. The inter-layer feature need not be of constant cross-sectional area. The inter-layer feature may have roughened surfaces so as to improve heat transfer of passing by fluid flows, or may be smooth. The number and location of inter-layer features can be in any arrangement in a stackup. They may be included in certain arrangements near certain impingement areas or nozzles; they may be included in other arrangements near other impingement areas or nozzles; and they may not be included at all near still other impingement areas or nozzles.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes.

What is claimed is:

1. An electronics assembly, comprising:
a first layer with a thickness;
at least one active heat-generating electronic element located in the first layer;
at least one passageway, co-located in the first layer with the at least one active heat-generating electronic element, that passes entirely through the thickness of the first layer, wherein the passageway is configured to conduct fluid therethrough, to extract heat from the at least one active heat-generating electronic element located in the first layer;
a second layer that is spaced from the first layer;
a second active heat-generating electronic element located in the second layer; and
a manifold layer between the first and second layers that defines a reservoir that is configured to hold fluid.

2. The assembly of claim 1, wherein the at least one passageway that passes entirely through the thickness of the first layer comprises a microjet nozzle that is configured to form a microjet.

3. The assembly of claim 2, further comprising a second passageway, co-located in the second layer with the second active heat-generating electronic element, that passes entirely through the thickness of the second layer, wherein the second passageway is configured to conduct fluid therethrough, to extract heat from the second active heat-generating electronic element located in the second layer.

4. The assembly of claim 1, wherein the manifold layer comprises a fluid outlet.

5. The assembly of claim 1, where the at least one passageway that passes entirely through the first layer is non-uniformly configured to provide cooling to hot spots on the second layer.

6. The assembly of claim 1, further comprising at least one structure spanning the spacing between the first and second layers such that the structure is in contact with the first and second layer.

7. The assembly of claim 6, where the at least one structure is configured to conduct heat.

8. The assembly of claim 6, where the at least one structure is configured to provide structural support of the electronics assembly.

9. The assembly of claim 6, where the at least one structure is configured to aid fluid routing.

10. The assembly of claim 1, where the at least one passageway that passes entirely through the thickness of the first layer contains a chamfer.

\* \* \* \* \*